United States Patent [19]

Quaschner

[11] 4,338,149
[45] Jul. 6, 1982

[54] PROCESS FOR MAKING CIRCUIT BOARDS HAVING RIGID AND FLEXIBLE AREAS

[75] Inventor: Wolfgang Quaschner, Geldern, Fed. Rep. of Germany

[73] Assignee: Kollmorgen Technologies Corporation

[21] Appl. No.: 204,660

[22] Filed: Nov. 6, 1980

[30] Foreign Application Priority Data

Nov. 20, 1979 [DE] Fed. Rep. of Germany ....... 2946726

[51] Int. Cl.³ .............................................. B32B 31/18
[52] U.S. Cl. ...................................... 156/248; 29/829; 29/830; 29/831; 29/832; 156/250; 156/256; 428/901
[58] Field of Search ............... 156/248, 250, 256, 265, 156/268; 428/901; 29/829, 830, 831, 832

[56] References Cited

U.S. PATENT DOCUMENTS 3,772,776 11/1973 Weisenburger ....................... 29/830
3,962,520 6/1976 Watanabe et al. .................. 428/901
4,184,729 1/1980 Parks et al. ............................ 29/830

OTHER PUBLICATIONS

*Adhesive Age*, "Adhesives for Flexible Printed Circuits", Daniel Holland, pp. 17-23, 1973.

*Primary Examiner*—Caleb Weston
*Attorney, Agent, or Firm*—Morgan, Finnegan, Pine, Foley & Lee

[57] ABSTRACT

A process for forming a circuit board having rigid and flexible areas which includes the steps of severing an area corresponding to the board area which is to be flexible, from a rigid layer material, leaving the severed rigid layer area in place coplanar and contiguous with the remainder of the rigid layer material, laminating a covering layer to one surface of said rigid material and said rigid layer area, laminating a flexible layer material to the other surface of the rigid material without lamination to the surface of the rigid layer area and, after said circuit board has been completed, severing said covering layer around said severed rigid layer area and removing said severed covering layer and said severed rigid layer area from said board.

12 Claims, 5 Drawing Figures

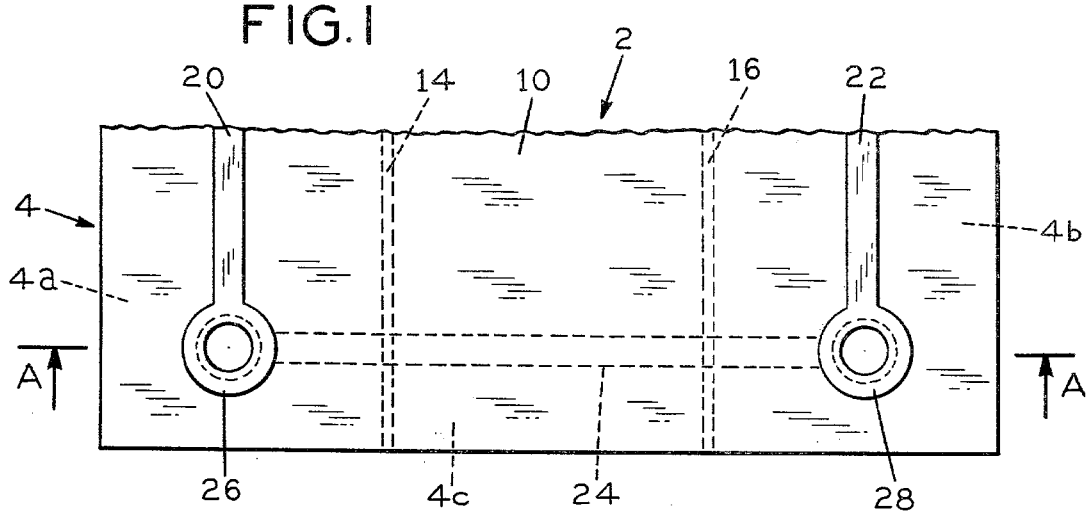
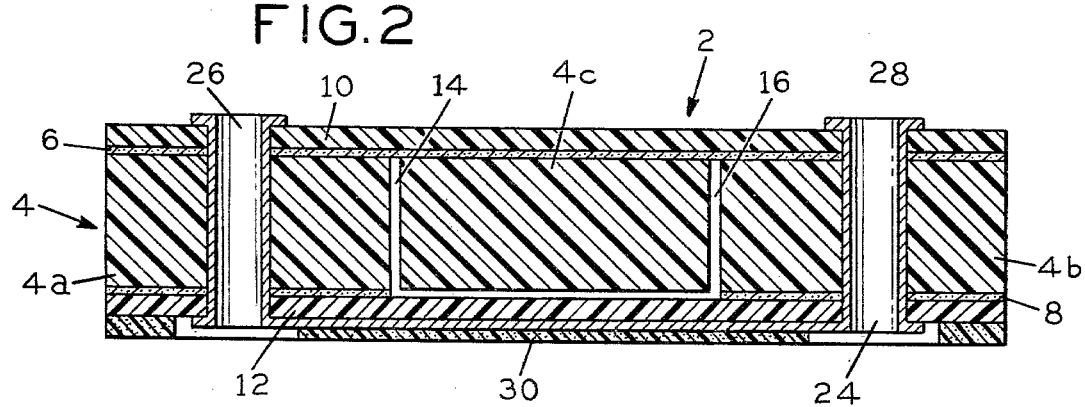
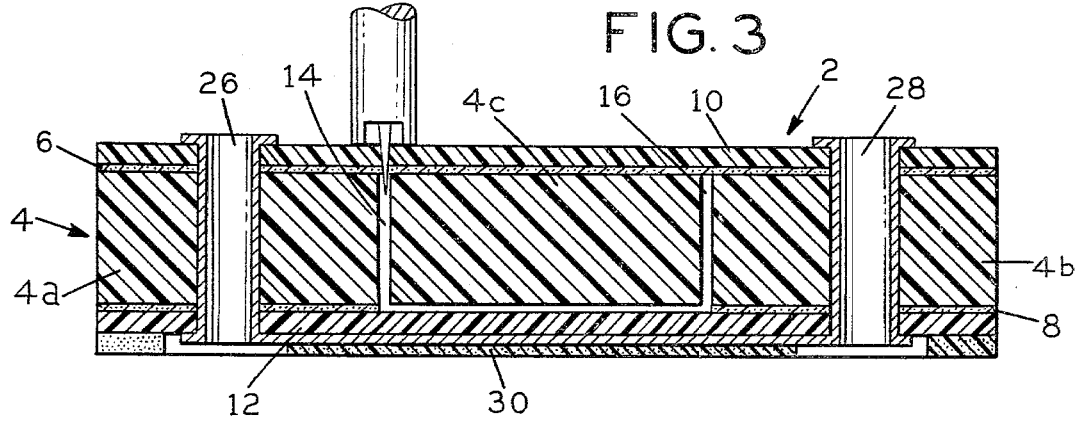

PROCESS FOR MAKING CIRCUIT BOARDS HAVING RIGID AND FLEXIBLE AREAS

This invention is concerned with a procedure for the production of circuit boards with rigid and flexible areas in which the circuits are made up of film, foil, or wires of metal, such as copper, formed into circuits on the circuit board.

In the production of circuit boards consisting of rigid and flexible areas, it has already been suggested to separately produce rigid circuit boards and flexible circuits in the usual, well known manner, and to then combine the rigid boards and flexible circuits into a circuit board having rigid and flexible areas. This method not only results in an expensive production operation, but also entails the significant disadvantage that the circuit boards so fabricated do not constitute a mechanical unit for subsequent processing. For example, building up and soldering such circuit boards so fabricated is expensive and complicated.

It has been suggested to produce circuit boards with rigid and flexible areas by laminating rigid boards and flexible individual layers with joining layers which are omitted in area to be flexible in the completed circuit board.

In such arrangement, one or both of the outer layers may consist of rigid material. Along the separating line between the areas to be rigid and the areas to be flexible and before the laminating process, the rigid layers are provided with a groove on the inside in relation to the area to be rigid and flexible in the completed circuit board. After lamination the rigid layers are grooved on the outside, again in relation to the areas to be rigid and flexible in the completed board and in relation to the inside groove. The material between the inside and outside grooves is broken out at a later point in time, for example after building up and soldering.

This grooving procedure is also expensive and complicated. First, the circuit board producer must provide the outer layers with a groove corresponding to about half the thickness of the material before lamination. After the completion of the circuit board, a corresponding groove must be cut from outside in order that the rigid material may be removed from the flexible area. This is not only an expensive operation but, to achieve the advantages of the rigid board unit during the build up and soldering operation, it is necessary to cut the second groove only after the building up and soldering processes are completed. Thus the grooving procedure cannot be carried out as a part of the circuit board production, but rather must be performed by the user of the circuit boards, i.e., after built up and soldered.

It has, heretofore, been suggested to cut the groove from the outside in such a manner as not to separate the rigid outer layers completely. Thus, the part of the rigid outer layer covering what will form the flexible part of the finished circuit board is still connected to the rigid circuit part by a thin, uncut layer of the outer layer. After building up and soldering, that part of the rigid layer covering the area which will form the flexible part of the circuit board is separated and removed by breaking the thin remaining connections in the layer. In order to break this connection, a buckling stress is required. Such buckling stress imparts undesirable buckling strain upon the circuits between the rigid area and the flexible area and leads to excessive stretching and possible mechanical and electrical failures in the circuit board during fabrication and, especially, during later use.

It is the purpose of this present invention, to produce circuit boards of rigid and flexible areas in a simple and economic way that does not suffer from the above mentioned disadvantages.

In the present invention circuit boards containing one or more printed circuits and having rigid and flexible areas are produced by laminating together rigid and flexible layers. In those areas of the rigid layer or layers where, in the finished circuit board, the area is to be flexible, the rigid layer is severed and separated from the adjoining rigid layer which, in the finished circuit board, will be rigid. The severed and separated rigid layer area is not removed at this time but remains in planar position with the adjoining rigid layer area. One side of the rigid layer, with the severed and separated rigid layer area in planar alignment, is covered with a support layer while the other side is covered with a flexible layer which, when the circuit board is finished and the severed and separated rigid layer area is removed, will make up the flexible circuit board area. The support layer, the rigid layer with the severed and separated rigid layer area in planar position and the flexible layer are then laminated together. This can be accomplished with an adhesive which may be heat or pressure responsive, preferably, heat and pressure responsive. The severed and separated layer area may remain adhesively free of the support and flexible layers but, preferably, is adhesively affixed to the support layer but, for reasons which will be more apparent later herein, remains adhesively free of the flexible layer.

The severed and separated rigid layer in the circuit board area to be flexible is separated and removed from the circuit board by severing the support layer along the lines of severing and separation of the rigid layer and by removing the severed support layer area and severed rigid layer area. The remaining rigid layer and laminated and continuous flexible layer now make up the circuit board.

In the practice of the invention, it is particularly useful to connect those areas in the rigid layers that are separated in lateral space and form rigid circuit board areas in the finished circuit boards with one another with support areas of the rigid layers which will not be present in the finished circuit board. This is accomplished by providing separation lines between the areas to be rigid and the areas to be flexible in the finished board and by leaving such separation lines completely void in the rigid layer of any connection. Thus, the rigid and flexible areas are rigidly fixed within the layer during the production process. In the subsequent processing of the circuit board, the rigid layer in the area to be flexible is removed. Preferably, such removal is accomplished after the building up and soldering of the circuit board.

Because the areas of the separation lines between the areas to be rigid and to be flexible stay completely free of connectors requiring breaking, the removal of the rigid layer does not result in any buckling strain of circuits or flexible layer material.

For the present purpose, it is useful to effect the laminating of the layers in the usual, known manner, through employment of the effects of heat and pressure. Where usually joining layers, for example so called "prepregs" are employed, those areas which will make up the flexible areas in the finished circuit boards are not laminated. Plastic materials, such as poly-imide or polyester, have proven well suited as material for use for the flexible layers.

Metal foils, preferably copper foils or metal lined, for example copper lined plastic layers, may be employed according to the invention.

After the lamination of the individual layers with one another and with support layers, a practically rigid unit results. Such rigid unit makes it possible for loading of transition areas between rigid and flexible areas of the circuit board resulting from transport and subsequent processing, as well as other stresses which would otherwise cause damage. Furthermore, the rigid areas in the board can be built up with elements in simple fashion similar to the usual build up of rigid circuit boards and can be processed in the normal way, for example in mass-soldering operation, such as, by immersion or by drag process.

To finish the circuit boards consisting of flexible and rigid areas in accordance with the invention, the support layer in the area or areas to be flexible are separated along the separation lines between the rigid and flexible areas and the rigid layer in the flexible area or areas are lifted out of the board and removed. Separation may be accomplished either by a manually operated or by mechanically operated separating mechanism, as, for example, with a separating knife appropriately controlled as to cutting depth. Since only the support layer needs to be cut through, along the separation lines, no material of the rigid layer or the flexible layer therebeneath is affected. Thus, a relatively uncomplicated mechanism is sufficient. Injury to the flexible circuit layer is avoided. The circuits and the flexible layer material are not subjected to any kind of buckling or other stress in the transition area from the rigid to the flexible areas of the circuit board as the rigid layer in the flexible area or areas is removed.

A further development of the invention has demonstrated that it is advantageous to employ a cutting laser ray for the separation of the support layer. This procedure is especially advantageous according to the invention by choosing materials that are in various frequency regions absorbing and reflecting. The materials are exposed to the laser beam first at the layer material to be separated and then, after the separation, at the flexible layer as a part of the circuit board beneath it. With suitable choice of the wavelength of the cutting laser the disintegration of the support layer material is achieved without any adverse effect upon the surface of the circuit layer below.

The invention of the instant application will be more fully described and will be better understood from the following description taken with the appended drawings in which FIG. 1 is a top plan view of a circuit board made following the process of the instant invention;

FIG. 2 is a sectional view taken at line A—A, Fig. 1;

FIG. 3 is a sectional view, similar to FIG. 2, but showing the rigid layer in the flexible area of the board being removed;

Figure 4:
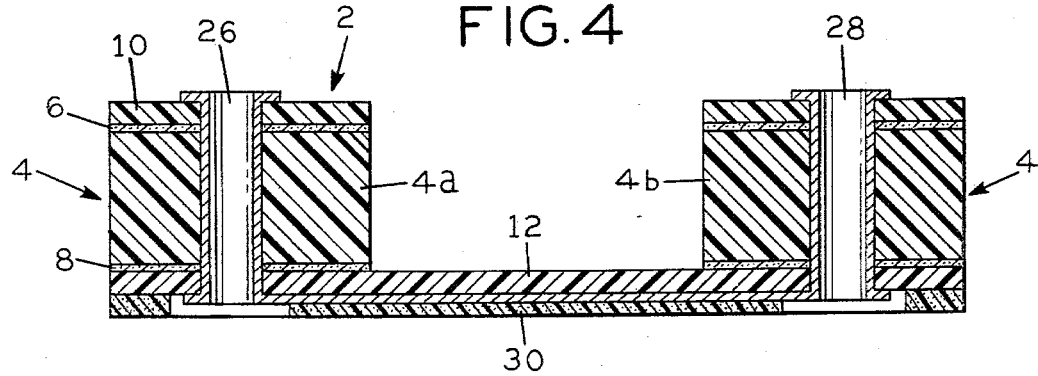
FIG. 4 is a sectional view, similar to FIG. 3, but showing the rigid layer removed.

Referring to FIGS. 1 and 2, the circuit board, generally designated 2, includes a rigid layer 4 having rigid areas 4a and 4b laminated by adhesive layers 6, 8, to layers 10, 12. Rigid layer 4 is of unlined, rigid material such, for example, as a hard epoxy resin-glass composite. Adhesive layers 6,8 may be of pre-impregnated material, impregnated with a pressure sensitive or heat sensitive adhesive, preferably an adhesive which is both pressure and heat sensitive. Such pre-preg may be a heat sensitive material cured before lamination to the "B" stage and fully cured to the "A" state at lamination. Cover layers 10, 12 are joined, respectively, to the opposite surface of rigid layer 4 by adhesive layers 6,8.

Cover layers 10, 12 are of a film, such as a poly-imide film, for example poly-imide film 60 mils thick and lined on the surface opposite the surface laminated with copper 35 mils thick. Such copper surface may subsequently be treated and processed, such as by print and etch, to form a printed circuit.

As best shown in FIGS. 1 and 2, the portion 4c of layer 4 is separated from rigid areas 4a and 4b by separation slots 14, 16, which extend through rigid layer 4 and separate the rigid areas 4a and 4b from area 4c which, following the process of the invention, will ultimately make up the flexible area in the finished circuit board. Area 4c may be separated from areas 4a and 4b and slots 14, 16, might be formed by cutting or stamping rigid layer 4. After cutting, stamping, or the like, area 4c is left in place, co-planar with areas 4a and 4b for reasons more apparent later herein. In the lamination of rigid layer 4 to cover layers 10, 12 which, as will be later described, also serve as the flexible layer in the area where the area of the solid layer is removed, at one surface of area 4c adhesive layer 8 is removed, such as by stamping out before lamination. Thus, in the laminating step, rigid layer area 4c is laminated to cover layer 10 but, at its opposite surface, is left free of cover layer 12.

The copper or metal clad surfaces of circuit board 2 are treated, in conventional manner, such as by print and etch, or such surfaces may be initially copper or metal free and the copper or metal might be added by sensitizing all or selected areas of the surface and by electroless metal deposition on the sensitized surface or areas. In any event, conductor paths 20, 22, 24 are formed on the opposite surface and interconnect with through-hole connectors 26, 28. After the conductor paths and through-hole connectors have been completed, one or both surfaces of the circuit board might be covered, in conventional manner, with an insulating layer or soldering mask 30. Mask 30, where applied, is provided with cut-outs or voids at the through-hole connectors. Such cut-outs or voids may be preformed in the insulating layer or mask before such layer or mask is applied to the circuit board.

In the practice of the process of the instant invention, rigid layer 4, layers 10, 12, adhesive layers 6, 8 and insulating layer or mask 30 are cut to size. Rigid layer 4 is milled or cut, such as by stamping, so that rigid layer area 4c which is to form the flexible board area when the circuit board has been formed and area 4c has been removed, is cut and separated from the remaining areas 4a and 4b of rigid layer 4. Three or more rigid layers 4 may be stacked, one on the other, cut to size and may then be milled or cut to separate area 4c from areas 4a and 4b.

Rigid layer 4, with area 4c in place and in planar alignment with areas 4a and 4b is then laminated with layers 10, 12 and adhesive layers 6, 8. The surfaces are then cleared with, for example, methylene chloride, the laminated board is tempered, the through-holes are drilled, de-burred, cleaned and the board is copper plated, electrolessly, photoprinted, etched, tempered solder masked and finished in the conventional manner, all with area 4c of rigid layer 4 in place, aligned in planar alignment with areas 4a and 4b and laminated to one, but not both, of the cover layers 10, 12.

After the board has otherwise been completed, area 4c, with the portion of the cover layer laminated thereto, is removed from the board. This is accomplished, as best shown in FIGS. 3 and 4, by cutting through cover layer 10 and adhesive layer 6 along separations 14, 16, and the other separation lines not shown in the drawings, separating area 4c from the remainder of rigid base 4 which is to form the rigid board areas. Area 4c, with the portion of cover layer 10 and ashesive layer 6 laminated thereto, is then lifted out or removed from the board. Thus, as best shown in FIG. 4, rigid layer areas 4a and 4b with cover layers 10, 12 and adhesive layers 6, 8 laminated thereto, with through-hole connectors 26, 28 passing therethrough and interconnected with printed circuit connectors 20, 22, 24, are flexibly interconnected by cover 12, laminated to rigid areas 4a and 4b and integral therewith and extending across the circuit board area of layer area 4c cut out of and removed from the finished circuit board. Thus, the multiple laminated rigid board area and the flexible board area are interconnected and joined by a continuous layer, rigid in the multiple laminated area but flexible therebetween.

The advantages of a rigid board during laminating and finishing is preserved while, by removal of area 4c after finishing, the advantages of a partially flexible board are obtained.

Figure 5:
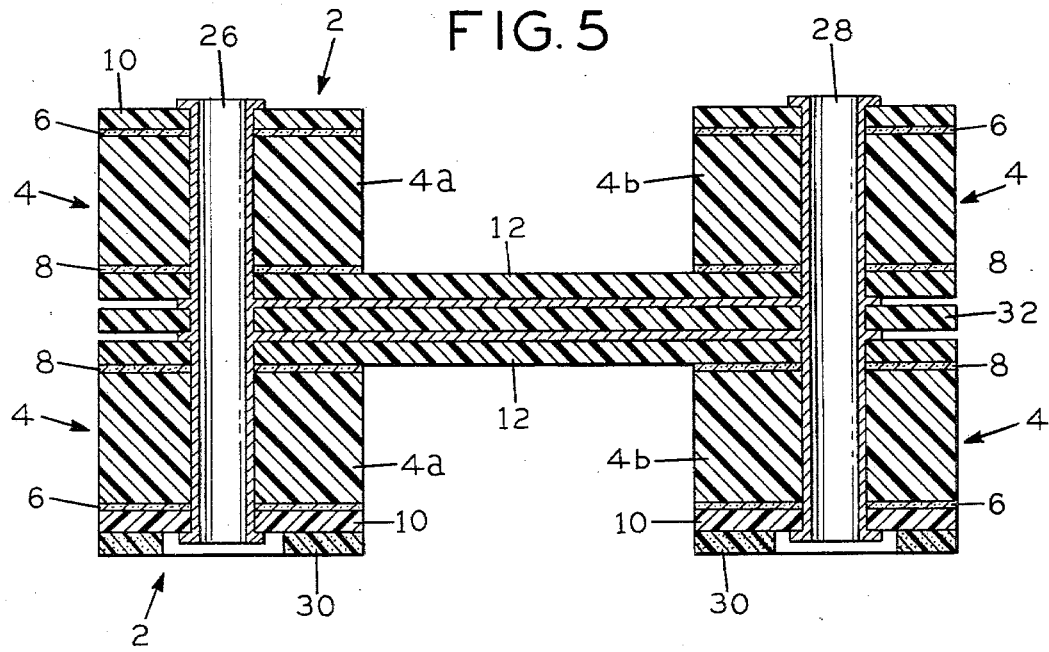
FIG. 5 is a sectional view, similar to FIG. 4, but showing a modified form of the circuit board made following the process of the invention.

As best shown in FIG. 5, circuit boards, with rigid and flexible areas, may be laminated together, back-to-back. Bonding layer 30, of the same material as cover layers 10, 12, but coated on its opposite surfaces with an adhesive, such as a heat and pressure sensitive adhesive, is positioned between the boards to be laminated and heat and pressure are applied. Such lamination might be done before area 4c is removed from the boards or after such removal.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed:

1. A process for the production of laminated circuit boards having rigid and flexible areas the steps comprising, separating from the rigid layer to be laminated with covering layers to make up the circuit board a rigid board area corresponding to the circuit board area to be flexible, while maintaining the separated rigid board area coplanar and contiguous with the area of the rigid layer to be rigid in the completed circuit board, laminating covering layers to the opposite surfaces of the rigid layer but to only one of the surfaces of the separated and coplanar rigid board area, severing said covering layer laminated to said one of the surfaces of said separated and coplanar rigid board area from the cover layer laminated to said rigid layer along the lines separating said rigid layer from said area to be flexible and removing from the laminated circuit board the separated rigid board area and the one covering layer laminated thereto, leaving in said laminated circuit board said rigid layer with the separated rigid board area removed therefrom and with the other covered layer laminated to the opposite side of said rigid layer and spanning the removed area forming therein a flexible board area.

2. A process, as recited in claim 1, in which said covering layer in the area of the separated and coplanar rigid board area and unlaminated to said rigid board area surface is bridged over said area and forms said flexible area in said circuit board.

3. A process, as recited in claim 1, in which said rigid layer, said covering layers and said one of the surfaces of said separated and coplanar rigid board area are laminated to each other by pressure.

4. A process, as recited in claim 1, in which said rigid layer, said covering layers and said one of the surfaces of said separated and coplanar rigid board area are laminated to each other by heat.

5. A process, as recited in claim 1, in which said rigid layer, said covering layers and said one of the surfaces of said separated and coplanar rigid board area are laminated to each other by heat and pressure.

6. A process, as recited in claim 1, in which the covering layer laminated to one surface of the rigid layer but which remains separated from the surface of the separated and coplanar rigid board area, is flexible.

7. A process, as recited in claim 6, in which said flexible covering layer is plastic.

8. A process, as recited in claim 7, in which said plastic flexible covering layer is coated on the side opposite the side laminated to said one surface of the rigid layer with a metal.

9. A process, as recited in claim 8, in which said metal is copper.

10. A process, as recited in claims 7, 8 or 9, in which said rigid layer, said covering layers and said one of the surfaces of said separated and coplanar rigid board area are laminated to each other by pressure.

11. A process, as recited in claims 7, 8 or 9, in which said rigid layer, said covering layers and said one of the surfaces of said separated and coplanar rigid board area are laminated to each other by heat.

12. A process, as recited in claim 7, 8 or 9, in which said rigid layer, said covering layers and said one of the surfaces of said separated and coplanar rigid board area are laminated to each other by heat and pressure.

* * * * *